United States Patent
Pandey et al.

(10) Patent No.: US 7,670,167 B2
(45) Date of Patent: *Mar. 2, 2010

(54) SOCKET THAT ENGAGES A PIN GRID ARRAY

(75) Inventors: Vinayak Pandey, Chandler, AZ (US); Mingji Wang, Chandler, AZ (US); Donald T. Tran, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/972,047

(22) Filed: Jan. 10, 2008

(65) Prior Publication Data

US 2008/0146065 A1 Jun. 19, 2008

Related U.S. Application Data

(63) Continuation of application No. 11/610,635, filed on Dec. 14, 2006, now Pat. No. 7,361,044.

(51) Int. Cl.
 *H01R 4/50* (2006.01)
(52) U.S. Cl. ..................................... 439/342
(58) Field of Classification Search ................ 439/342, 439/733.1, 746, 747, 748
 See application file for complete search history.

(56) References Cited

U.S. PATENT DOCUMENTS

| | | | |
|---|---|---|---|
| 2,664,552 A | 12/1953 | Ericsson et al. | |
| 3,391,383 A | 7/1968 | Antes | |
| 3,539,489 A * | 11/1970 | Ness ........................... | 204/489 |
| 4,139,255 A * | 2/1979 | Otani ......................... | 439/748 |
| 4,799,128 A | 1/1989 | Chen | |
| 5,044,973 A * | 9/1991 | Noda et al. .................. | 439/296 |
| 5,164,818 A | 11/1992 | Blum et al. | |
| 5,264,729 A | 11/1993 | Rostoker et al. | |
| 5,669,783 A | 9/1997 | Inoue et al. | |
| 5,926,375 A | 7/1999 | Watanabe et al. | |
| 6,545,224 B2 | 4/2003 | Sawada et al. | |

(Continued)

OTHER PUBLICATIONS

"U.S. Appl. No. 11/610,635 Response filed 09/28/2007 in response to Non-Final Office Action mailed Aug. 10, 2007", 7 pgs.

(Continued)

*Primary Examiner*—Phuong K Dinh
(74) *Attorney, Agent, or Firm*—Schwegman, Lundberg & Woessner, P.A.

(57) ABSTRACT

An example socket includes a plurality of contacts and a base. The base includes exterior walls and interior walls which extend between the exterior walls to form openings within the base such that each opening in the base includes one of the contacts. At least some interior walls include indentations that are adapted to receive projections on the contacts such that when the projections on the contacts are positioned within indentations in the interior walls, the contacts are secured to the base. Another example socket includes a first group of the interior walls that is oriented in a first direction and a second group of the interior walls oriented in a second direction that is orthogonal to the first direction. The first and second groups of interior walls form openings within the base with the first group of interior walls being higher than the second group of interior walls.

8 Claims, 20 Drawing Sheets

U.S. PATENT DOCUMENTS

| | | | |
|---|---|---|---|
| 6,699,055 B2 * | 3/2004 | Peng et al. | 439/342 |
| 7,021,975 B2 | 4/2006 | Lappohn | |
| 7,095,619 B2 | 8/2006 | Panella et al. | |
| 7,175,462 B2 * | 2/2007 | Hashimoto | 439/342 |
| 7,209,366 B2 | 4/2007 | Prokofiev et al. | |
| 7,361,044 B1 | 4/2008 | Pandey et al. | |

OTHER PUBLICATIONS

"U.S. Appl. No. 11/610,635, Notice of Allowance mailed Nov. 28, 2007", 2 pgs.

"U.S. Appl. No. 11/610,635 Non-Final Office Action Mailed Aug. 10, 2007", 3 pgs.

* cited by examiner

SOCKET THAT ENGAGES A PIN GRID ARRAY

This application is a continuation of U.S. patent application Ser. No. 11/610,635, filed on Dec. 14, 2006, now issued as U.S. Pat. No. 7,361,044, which is incorporated herein by reference.

TECHNICAL FIELD

Some example embodiments of the present invention relate to a socket that engages an electronic package, and more particularly to a socket that engages a pin grid array on an electronic package.

BACKGROUND

The processors in integrated circuits and other electronic assemblies are continually being required to handle an ever-increasing number of signals. A typical processor often requires additional signals in order to operate at higher frequencies and to simultaneously perform more logic and memory operations.

Electrical sockets are often used to secure electronic packages that include processors onto a system board (e.g., a mother board or a printed circuit board (PCB)). Most sockets are typically constructed for easy installation and replacement of the electronic packages.

Many sockets include contacts that are assembled within the socket to provide an electrical connection between the system board and the electronic package that includes the processor. Solder balls are usually attached to each contact so that a reflow process bonds the socket to the PCB.

There is a need for a socket that has a higher contact density in order to increase the number of signals that may be simultaneously sent to a processor which is within an electronic package. In addition, increasing the contact density within a socket may allow the overall size of an electronic package to be reduced depending on the configuration of the electronic system that includes the processor.

DETAILED DESCRIPTION

The following detailed description references the accompanying drawings. Like numerals describe substantially similar components throughout each of the drawings. Other embodiments may be used, and structural, logical, and electrical changes made. The sockets and electronic systems described herein can be manufactured, used, or shipped in a number of positions and orientations.

In some embodiments, the socket and the electronic system provide a current path for supplying signals to a processor. Signals are supplied to a processor, or die, using contacts that are included in the socket. The configuration of the socket allows the socket size to be minimized and/or additional signals to be delivered to the processor.

Figure 1:
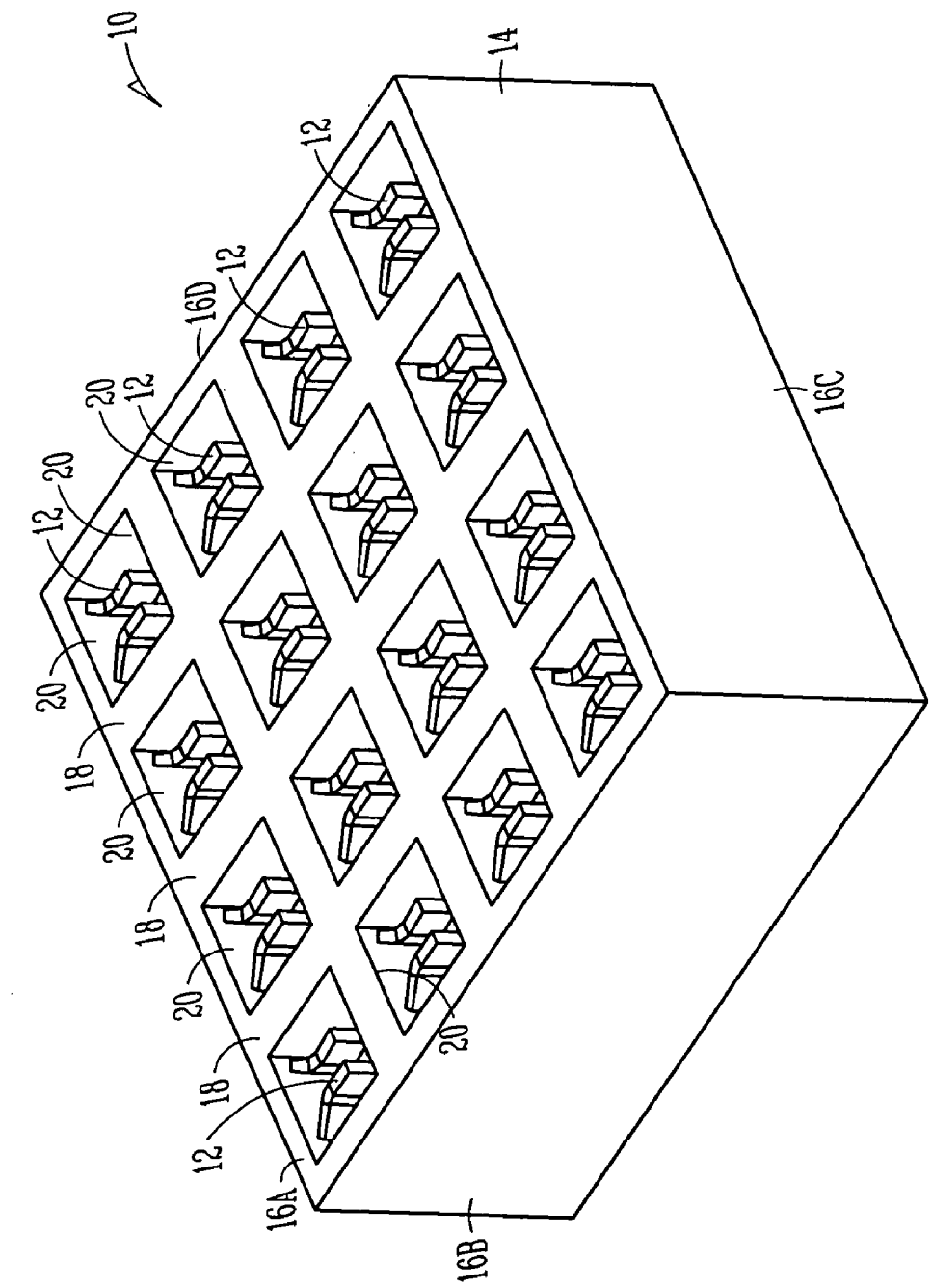
FIG. 1 is a perspective view illustrating a portion of an example socket.
Figure 2:
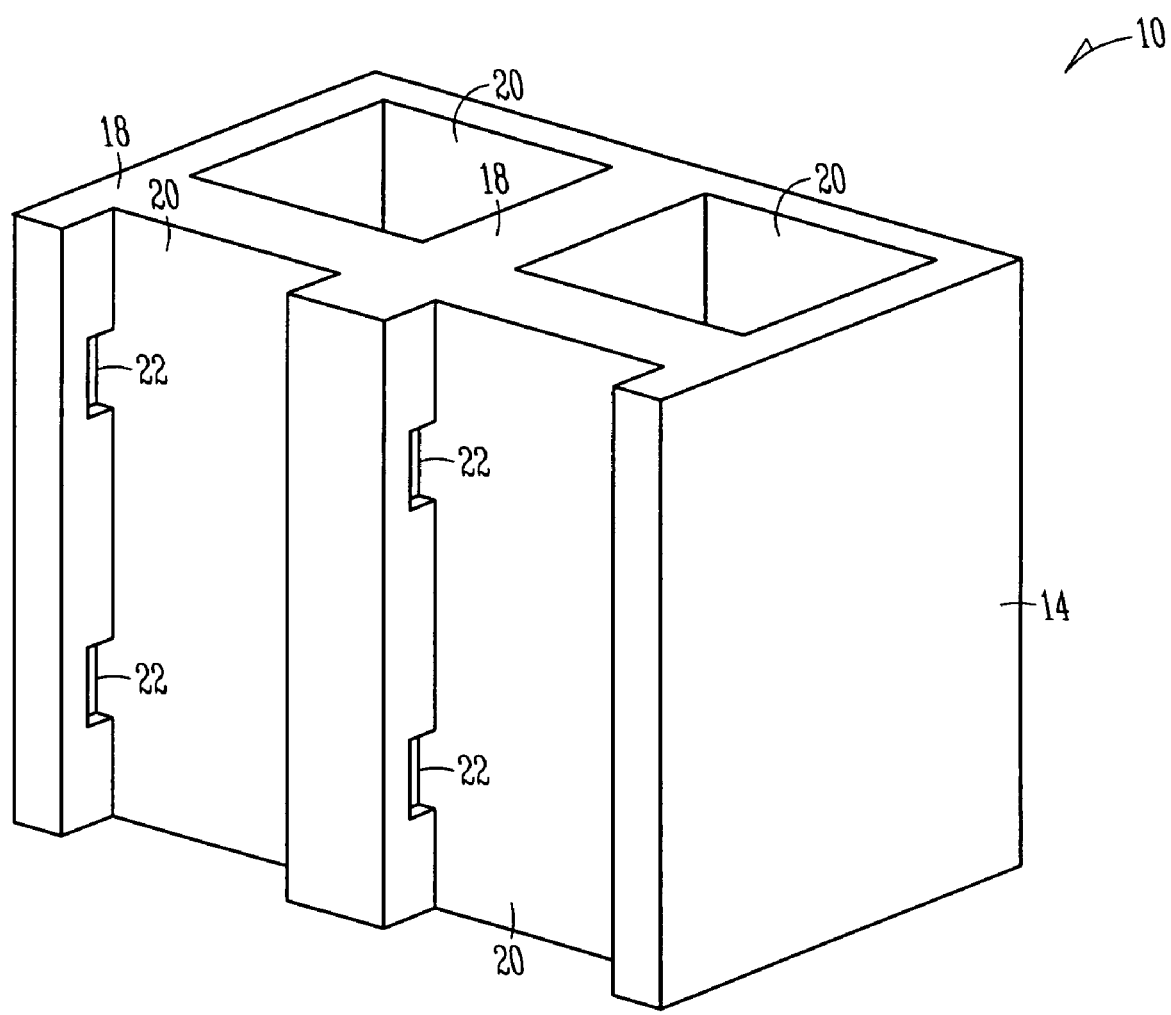
FIG. 2 is an enlarged perspective view of the socket shown in FIG. 1.
Figure 3:
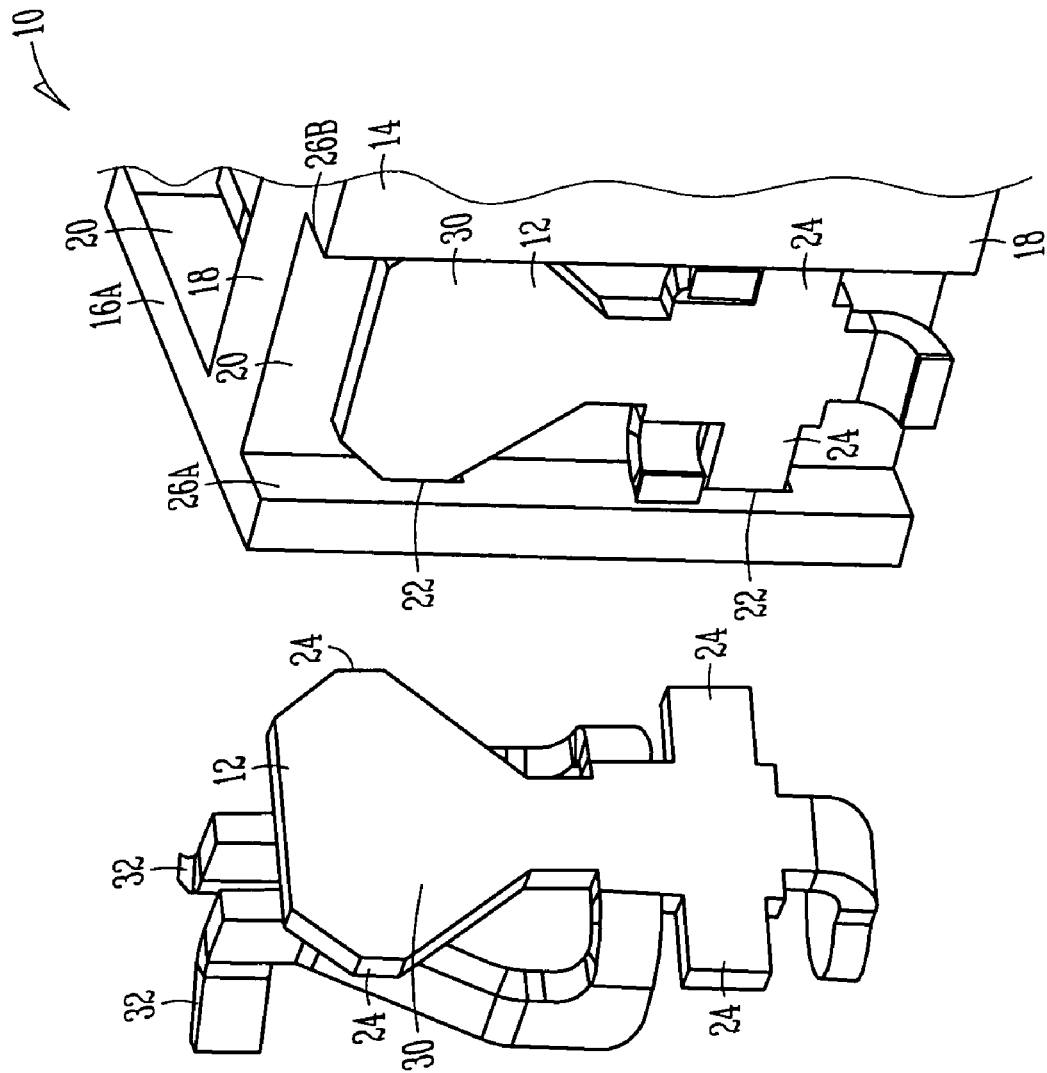
FIG. 3 is an enlarged perspective view of the socket shown in FIG. 1 with a contact attached to the base of the socket and the contact shown again from another perspective.

FIGS. 1-3 illustrate an example socket 10 for an electronic package. The socket 10 includes a plurality of contacts 12 and a base 14. The base 14 includes exterior walls 16A, 16B, 16C, 16D and a plurality of interior walls 18 which extend between the exterior walls 16A, 16B, 16C, 16D to form a plurality of openings 20 within the base 14 such that each opening 20 in the base 14 includes one of the plurality of contacts 12. Although each opening 20 in FIGS. 1 and 2 is shown as being the same size, the plurality of interior walls 18 may form openings of more than one size.

As shown most clearly in FIG. 2 because the contacts 12 are removed from the socket 10, at least some of the interior walls 18 include indentations 22. The indentations 22 are adapted to receive projections 24 on the contacts 12 (see FIG. 3) such that when the projections 24 on the contacts 12 are positioned within indentations 22 in the interior walls 18, the contacts 12 are secured to the base 14. Although each indentation 22 and projection 24 in FIGS. 2 and 3 is shown as having a rectangular shape, the size and shape of the indentations 22 and projections 24 may be modified to facilitate insertion and holding of the contacts 12 within the openings 20.

FIGS. 2 and 3 show that opposing sides 26A, 26B of some (or all) of the openings 20 in the base 14 may include indentations 22. However, the indentations 22 may be on any or all sides of the openings 20.

In some embodiments, each contact 12 may include four projections 24 that extend into four indentations 22 in the interior walls 18 of the base 12. FIG. 3 shows an example embodiment where two of the four projections 24 on each contact 12 extend into indentations 22 in an interior wall 18 on one side 26A of an opening 20 and the other two projections 24 on each contact 12 extend into indentations 22 in an interior wall 18 on an opposing side 26B of the opening 20. The number and location of the indentations 22 will depend in part on the design of the projections 24 on the contacts 12.

Figure 4:
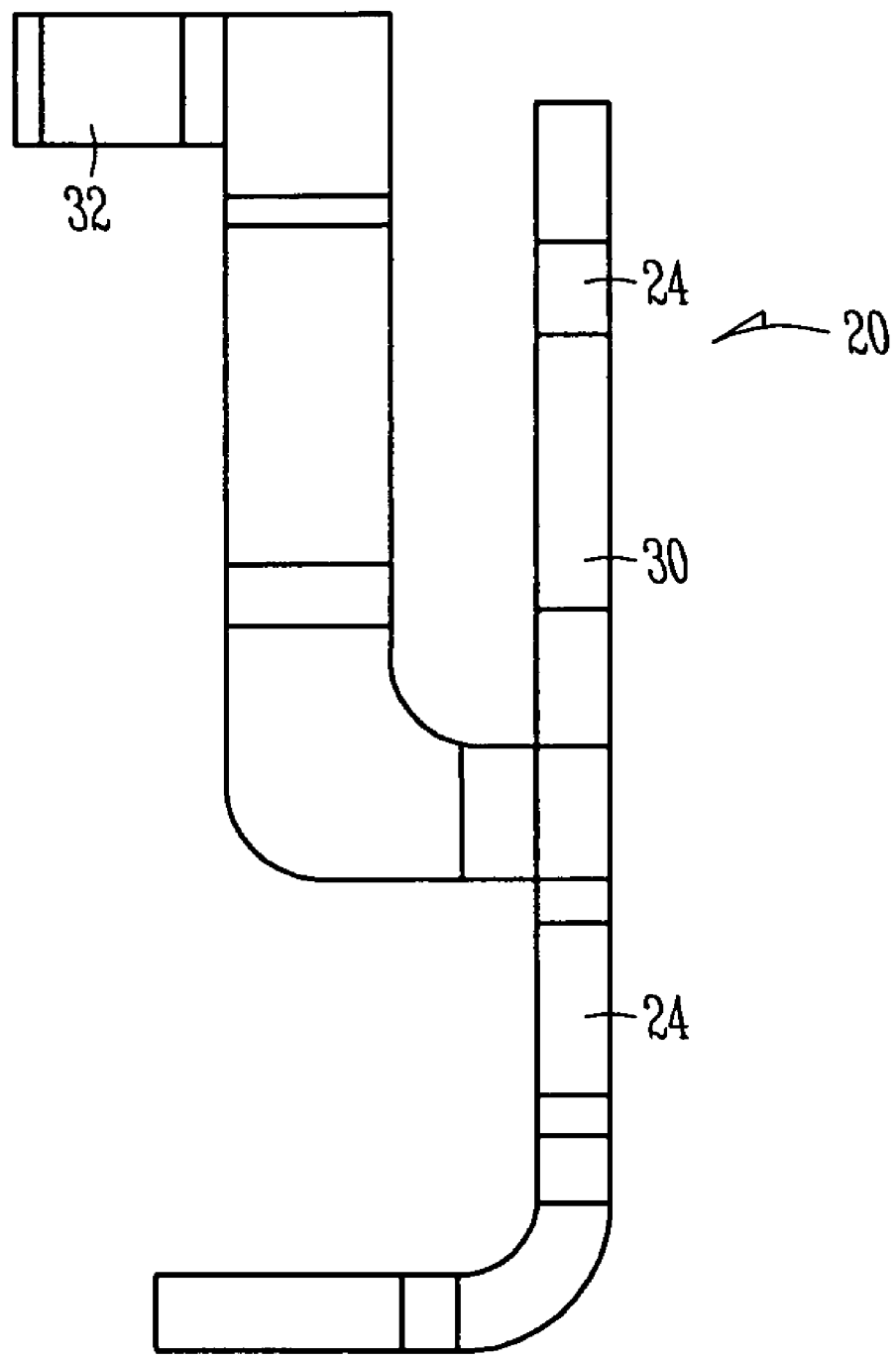
FIG. 4 is a side view of the contact shown in FIG. 3.

As shown in FIGS. 3 and 4, each contact 12 may include a flat section 30 and a pair of arms 32 that extend from the flat section 30. In some embodiments, the flat section 30 of each contact 12 may include the projections 24 that extend into the indentations 22 in the interior walls 18 of the base 14.

In addition, each contact 12 may be positioned within an opening 20 such that the flat section 30 of each contact 12 is positioned against one of the interior walls 18 that form the opening 20 (see FIG. 3). The size and shape of the flat section 30 and the arms 32 will depend in part on the size of the openings 20 in the base 14 and other design considerations that are associated with an electronic system that includes the socket 10.

Figure 5:
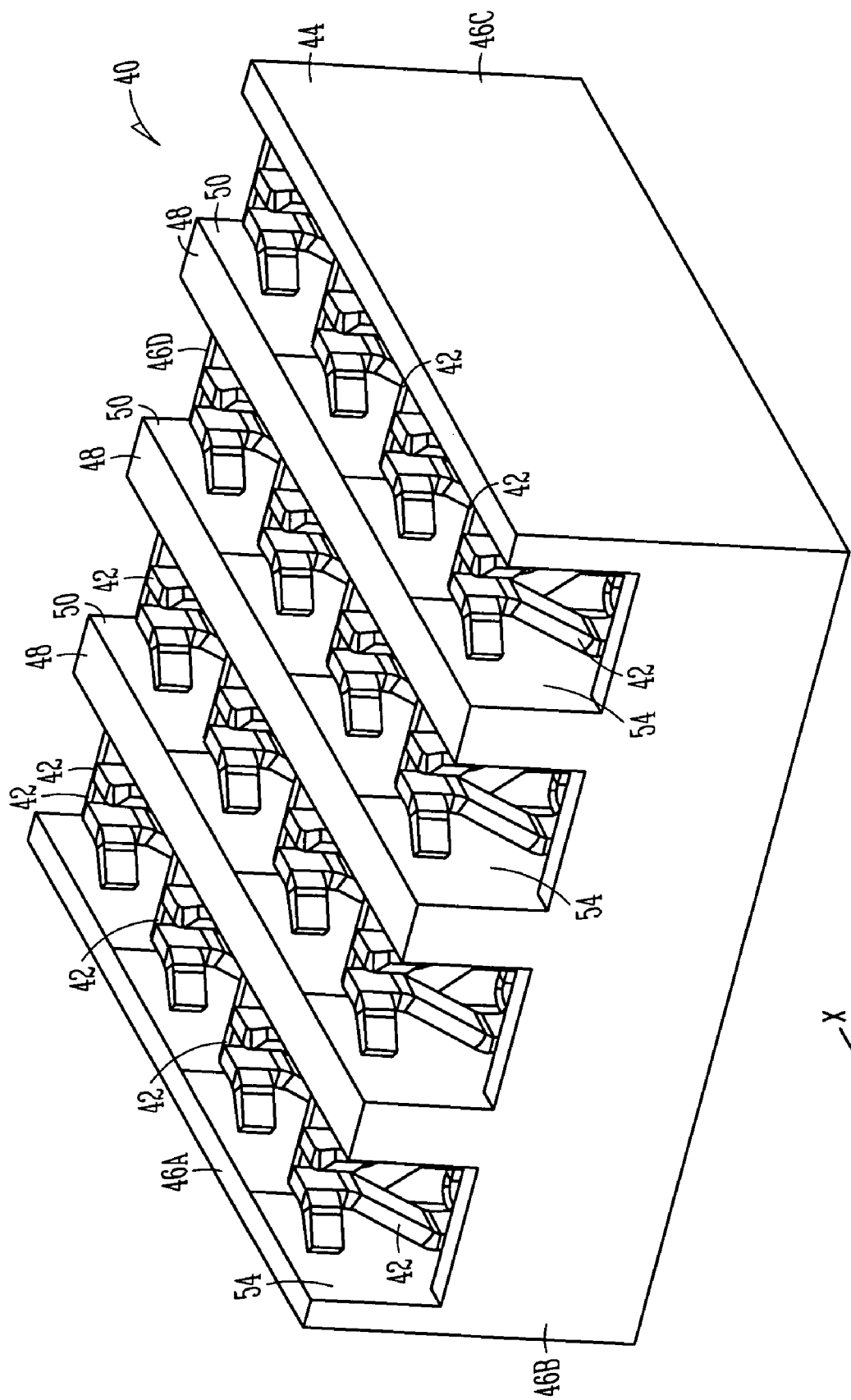
FIG. 5 is a perspective view illustrating a portion of another example socket.

FIG. 5 illustrates another example socket 40 for an electronic package. The socket 40 includes a plurality of contacts 42 and a base 44. The base 44 includes exterior walls 46A, 46B, 46C, 46D and a plurality of interior walls 48. A first group 50 of the interior walls 48 is oriented in a first direction X and a second group 52 of the interior walls 48 is oriented in a second direction Y that is orthogonal to the first direction X.

The first and second groups 50, 52 of interior walls 48 form a plurality of openings 54 within the base 44 such that each opening 54 in the base 44 includes one of the plurality of contacts 42. Although each opening 54 in FIG. 5 is shown as being the same size, the plurality of interior walls 48 may form openings 54 of more than one size.

In the illustrated example embodiment, the first group 50 of interior walls 48 is higher than the second group 52 of interior walls 48. The degree to which the first group 50 of interior walls 48 is higher than the second group 52 of interior walls 48 will depend in part on the design of any pin grid arrays that get connected to the contacts 42 which are part of the socket 40.

Figure 6:
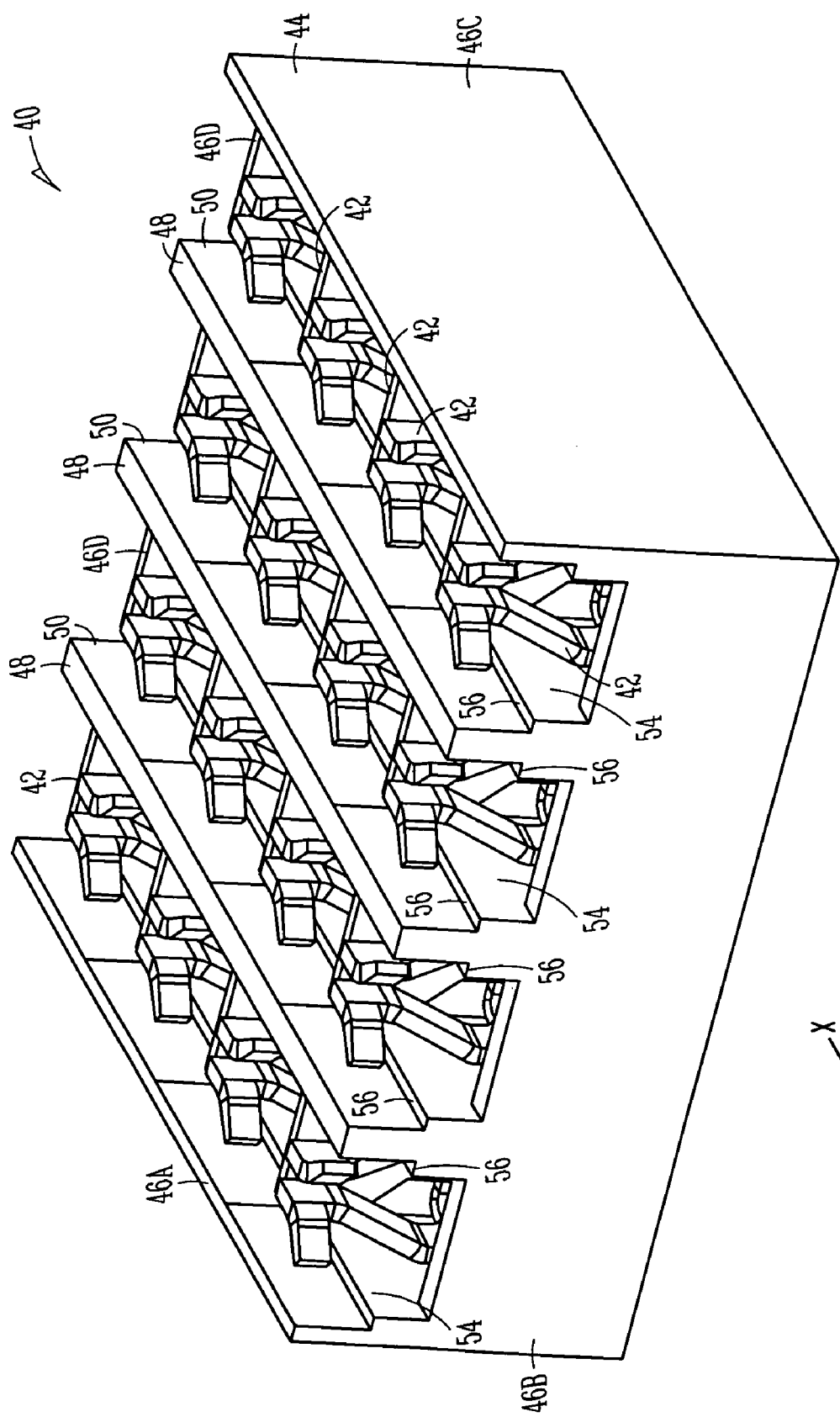
FIG. 6 is a perspective view illustrating another portion of another form of the example socket shown in FIG. 5.
Figure 7:
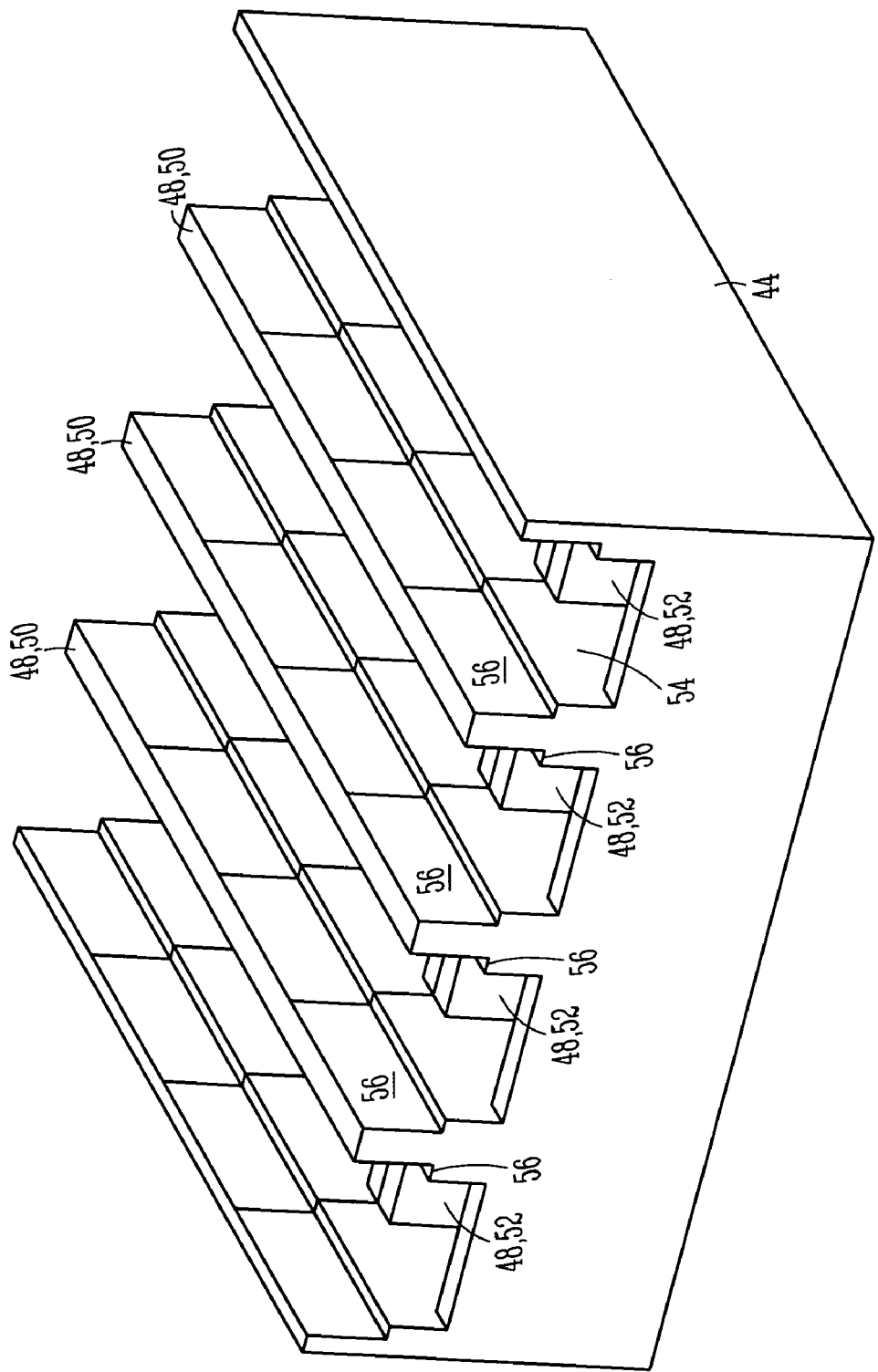
FIG. 7 is a perspective view of the example socket shown in FIG. 6 with the contacts removed from the socket.

As shown in FIGS. 6 and 7, each of the interior walls 48 in the first group 50 of interior walls 48 may include a stepped section 56 on each side of the interior walls 48 in the first group 50 of interior walls 48. In addition, the stepped sections 56 may be located on the first group 50 of interior walls 48 such that the stepped sections 56 are higher than the second group 52 of interior walls 48 (see FIG. 7). The stepped sections 56 may permit the overall pitch of the socket 40 to be reduced because the stepped sections 56 allow more relative movement of the arms on the contacts 42 when pins in a pin grid array are mated with the contacts 42.

Figure 8:
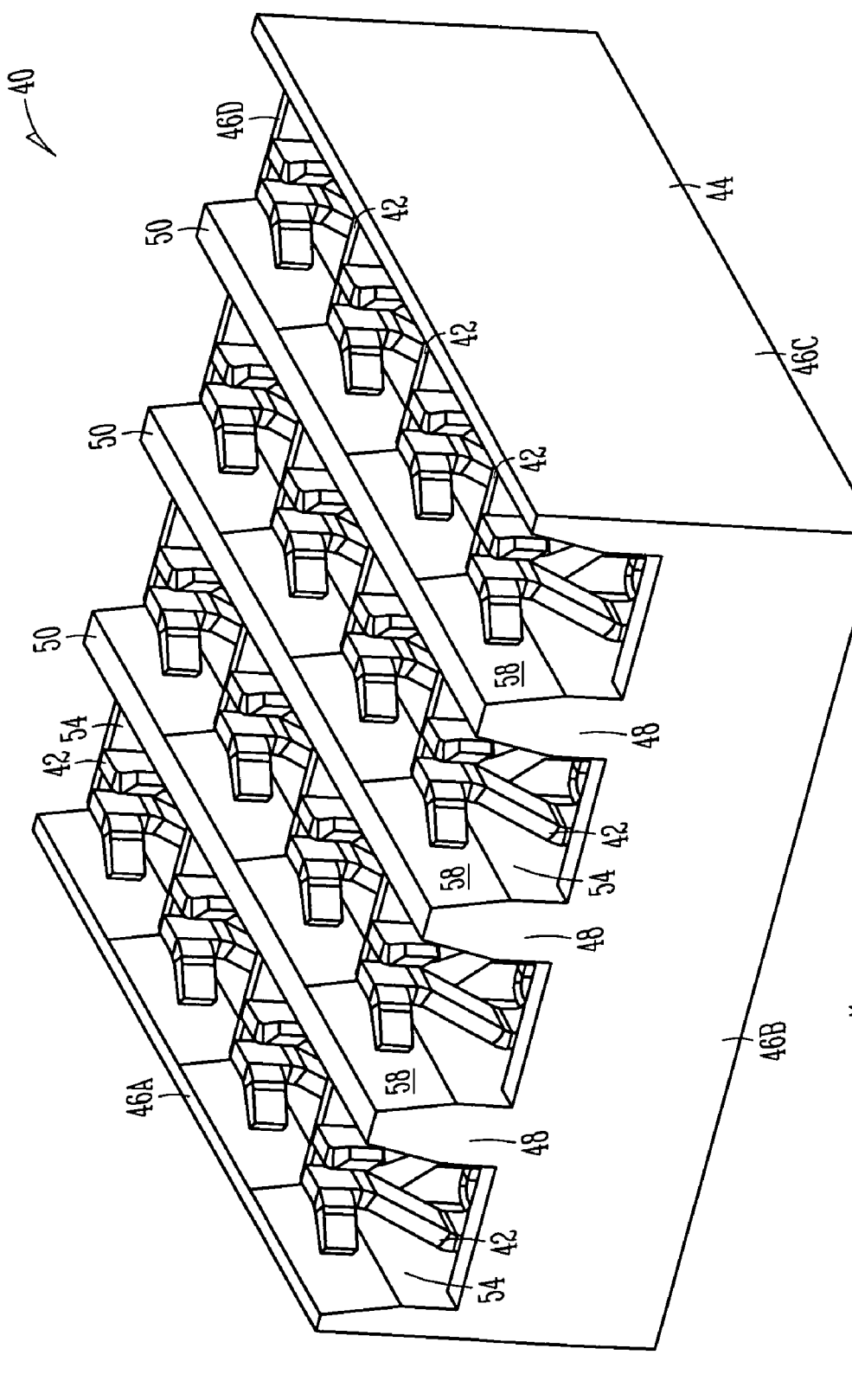
FIG. 8 is a perspective view illustrating another portion of another form of the example socket shown in FIG. 5.
Figure 9:
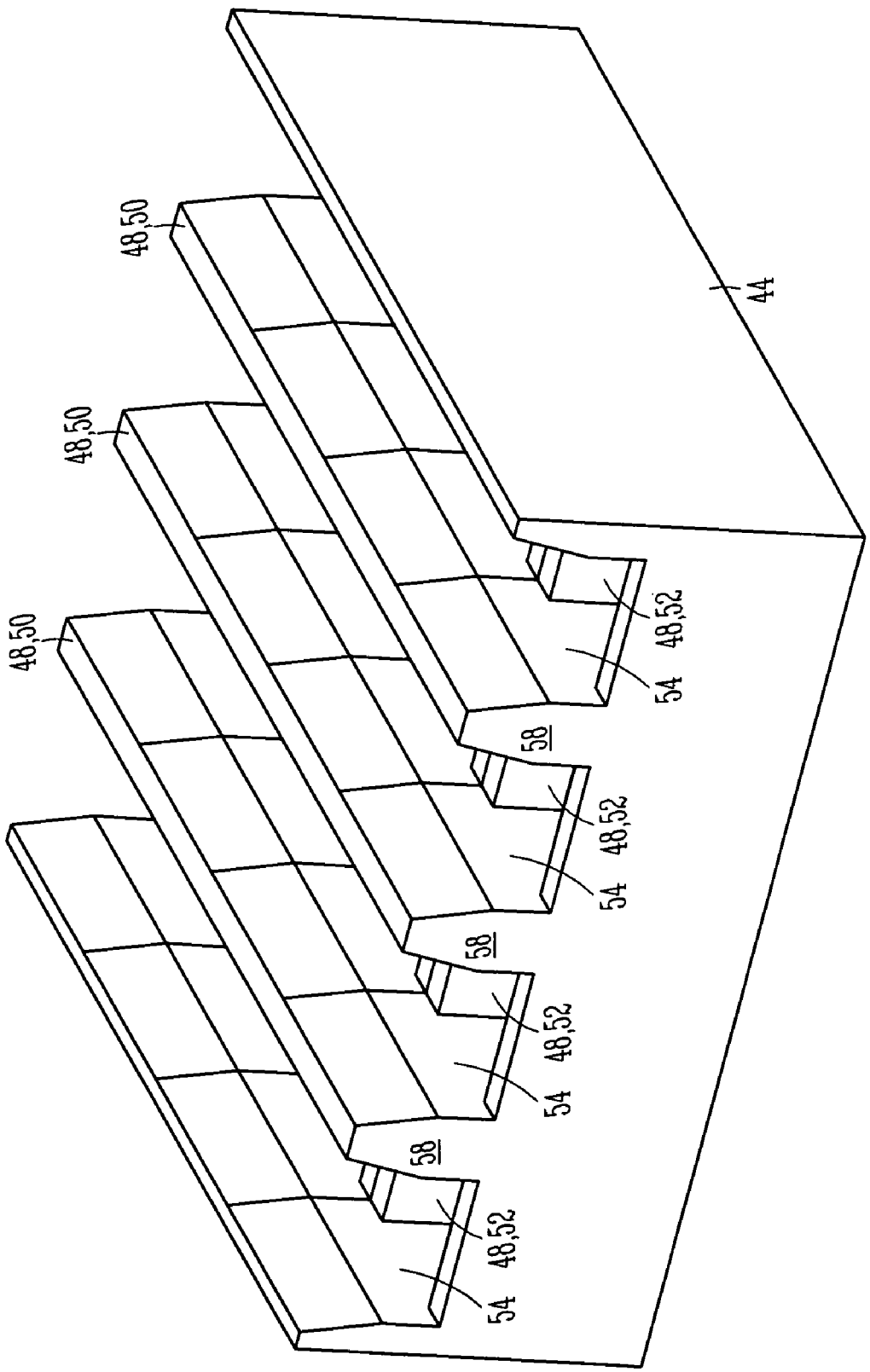
FIG. 9 is a perspective view of the example socket shown in FIG. 8 with the contacts removed from the socket.

As shown in FIGS. 8 and 9, each of the interior walls 48 in the first group 50 of interior walls 48 may include a tapered section 58 on the interior walls 48 in the first group 50 of interior walls 48. In addition, the tapered sections 58 may be located on the first group 50 of interior walls 48 such that the tapered sections 58 are higher than the second group 52 of interior walls 48 (see FIG. 9). The tapered sections 58 may permit the overall pitch of the socket 40 to be reduced because the tapered sections 58 allow more relative movement of the arms on the contacts 42 when pins in a pin grid array are mated with the contacts 42.

Figure 10:
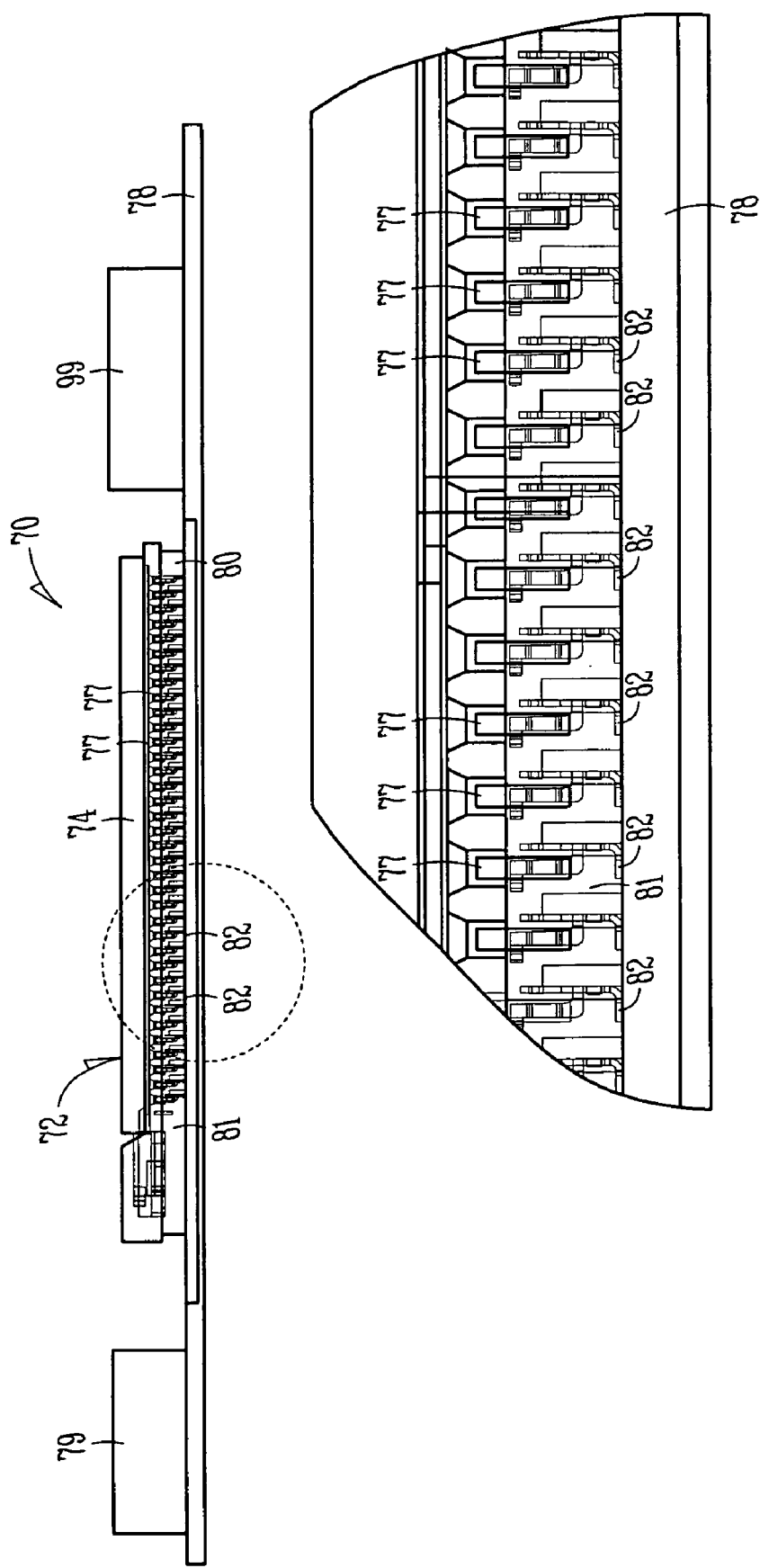
FIG. 10 illustrates schematic side views of an electronic system that includes a socket which engages an electronic package with a pin grid array.

FIG. 10 illustrates an example electronic system 70 that includes an electronic package 72. The electronic package 72 includes a die 74 and a pin grid array that is electrically connected to the die 74.

The electronic system 70 further includes a socket 80. The socket 80 includes a base 81 and a plurality of contacts 82 which engage the pins 77 in the pin grid array. It should be noted that the number, location and size of the pins 77 in the pin grid array will depend in part on the type of die 74 that is included in the electronic system 70 as well as the type of applications where the electronic system 70 will be used.

In some embodiments, the electronic system 70 may further include a printed circuit board 78 such that the socket 80 is mounted to the printed circuit board 78. As an example, the socket 80 may be mounted to the printed circuit board 78 using a ball grid array.

Figure 11:
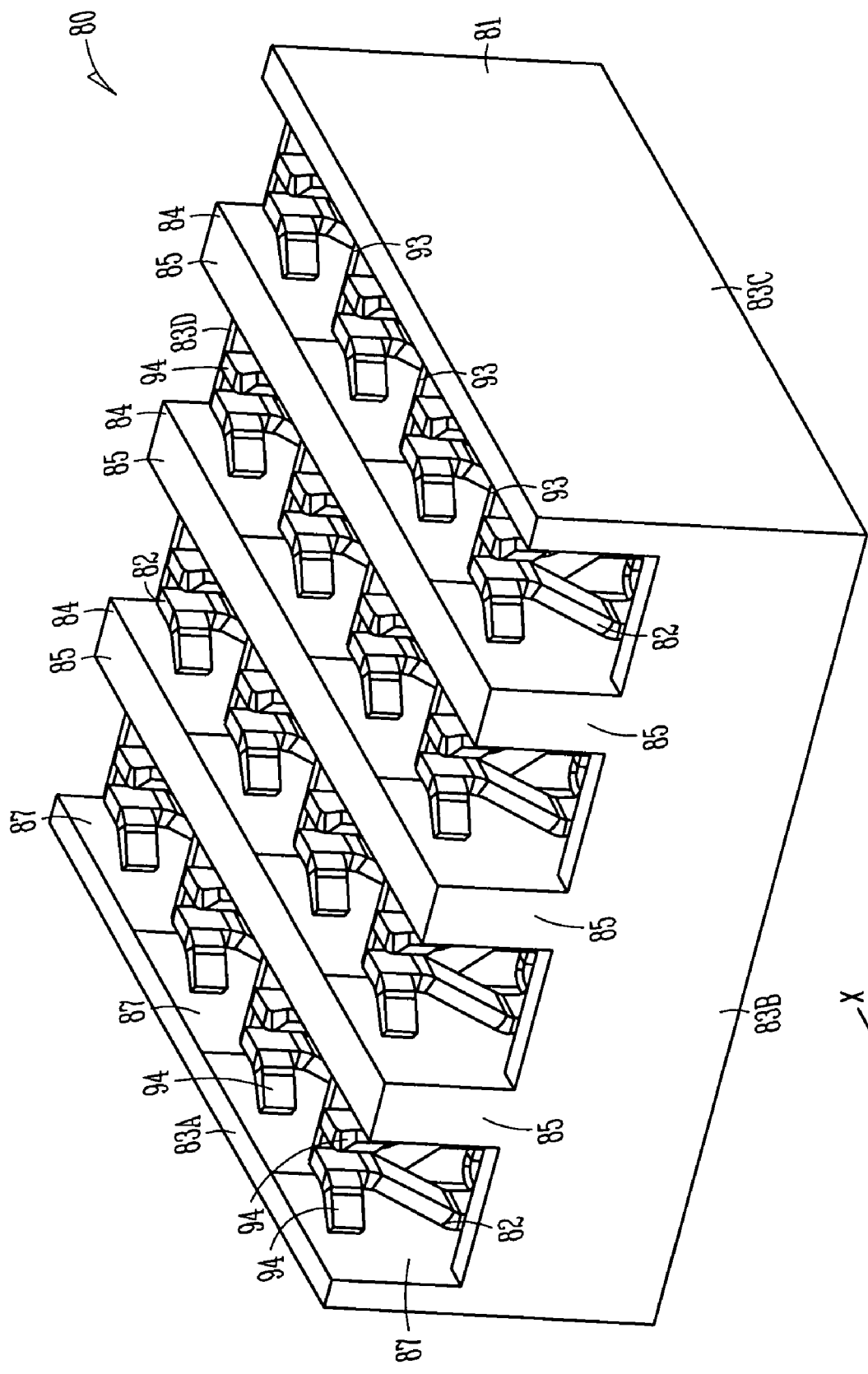
FIG. 11 is a perspective view illustrating a portion of an example socket that may be used in the electronic system shown in FIG. 10.

As shown in FIG. 11, the base 81 includes exterior walls 83A, 83B, 83C, 83D and a plurality of interior walls 84. A first group 85 of the interior walls 84 may be oriented in a first direction X and a second group 86 of the interior walls 84 may be oriented in a second direction Y that is orthogonal to the first direction X.

The first and second groups 85, 86 of interior walls 84 form a plurality of openings 87 within the base 81 such that each opening 87 in the base 81 includes one of the contacts 82. Although each opening 87 in FIG. 11 is shown as being the same size, the plurality of interior walls 84 may form openings 87 of more than one size.

In the illustrated example embodiment, the first group 85 of interior walls 84 is higher than the second group 86 of interior walls 84. The degree to which the first group 85 of interior walls 84 is higher than the second group 86 of interior walls 84 will depend in part on the design of the pin grid array that gets connected to the contacts 82.

Figure 12:
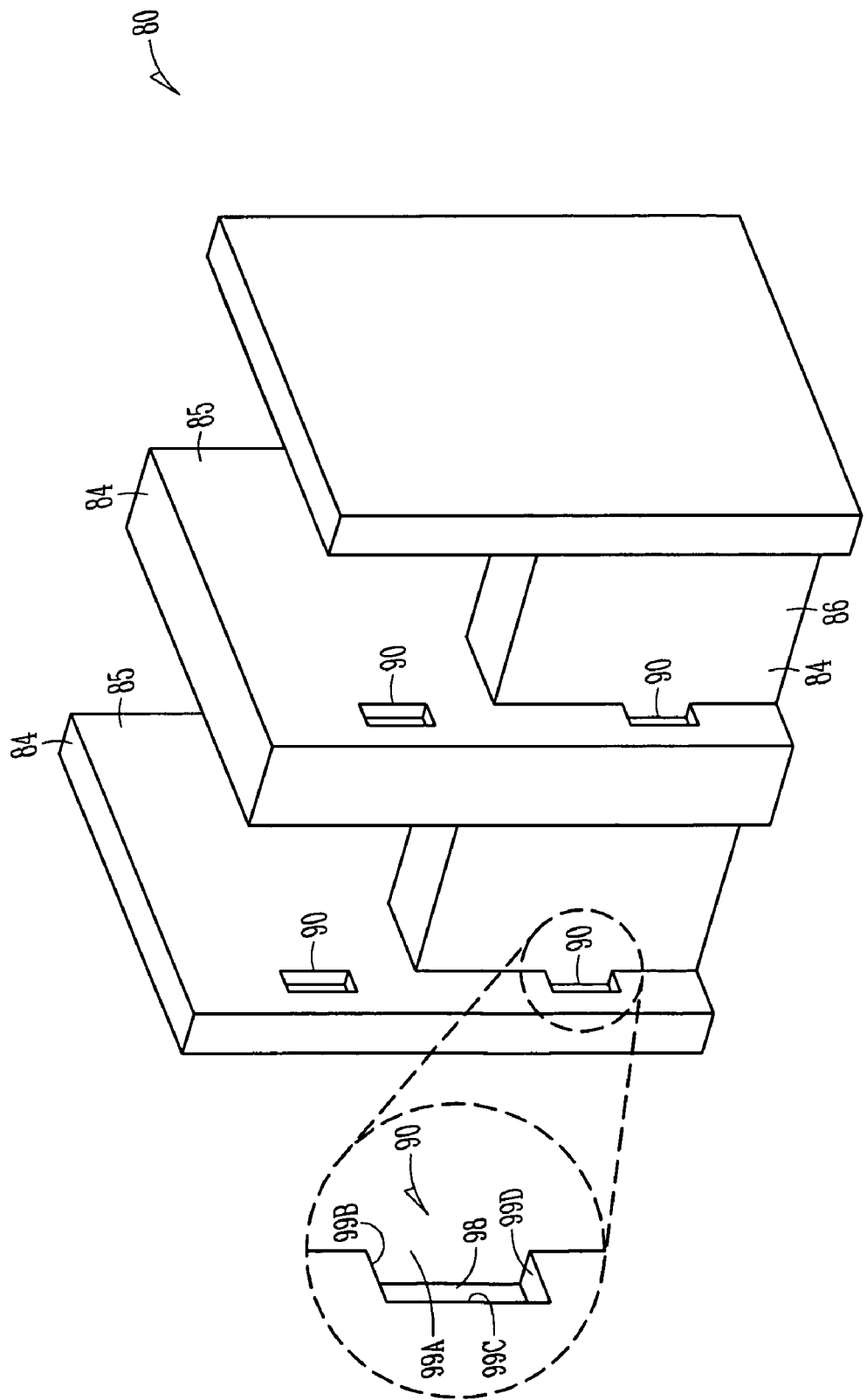
FIG. 12 is an enlarged perspective view of the socket shown in FIG. 11.
Figure 13:
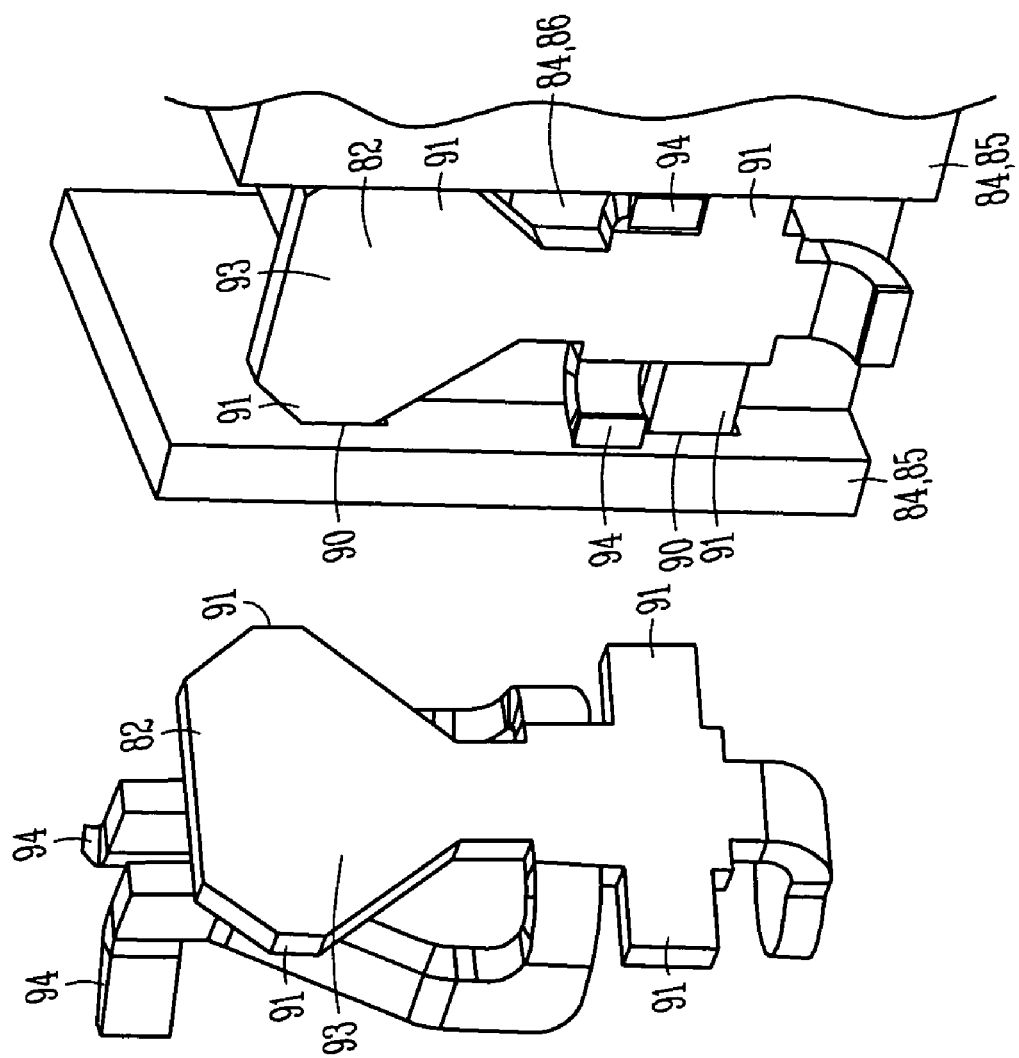
FIG. 13 is an enlarged perspective view illustrating a portion of the socket shown in FIG. 11 with a contact attached to the base of the socket and the contact shown again from another perspective.

As shown in FIGS. 12 and 13, at least some of the interior walls 84 may include indentations 90 that receive projections 91 on the contacts 82 such that when the projections 91 on the contacts 82 are positioned within indentations 90 in the interior walls 84, the contacts 82 are secured to the base 81. In the example embodiment that is illustrated in FIG. 12, the indentations 90 include a base wall 98 and four side walls 99A, 99B, 99C, 99D.

In some embodiments, the interior walls 84 in the first group 85 of interior walls 84 include the indentations 90. Although each indentation 90 and projection 91 in FIGS. 12 and 13 is shown as having a rectangular shape, the size and shape of the indentations 90 and projections 91 may be modified to facilitate insertion and holding of the contacts 82 within the openings 87.

Figure 14:
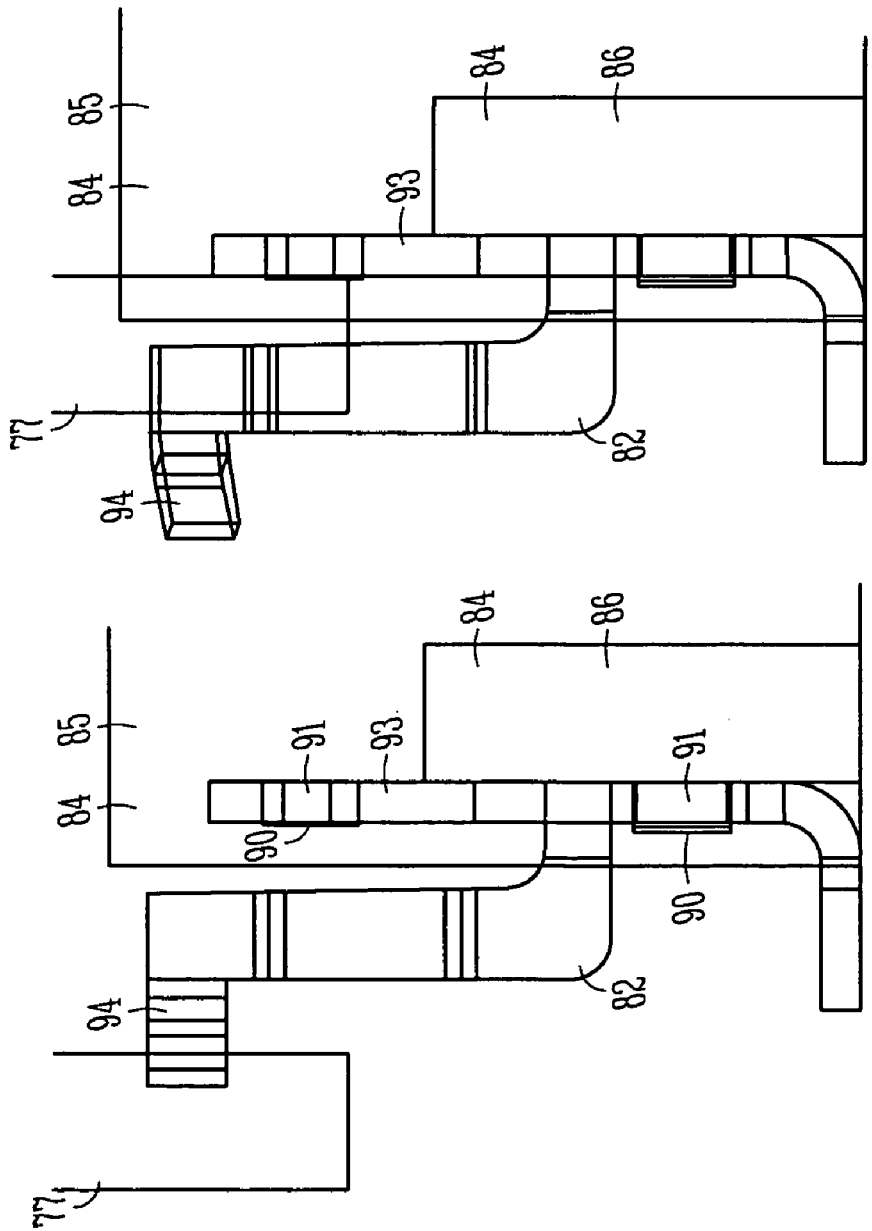
FIG. 14 is a schematic side view illustrating a portion of the socket shown in FIG. 11 where a pin is shown moving to engage a flat section of the contact.

FIGS. 13 and 14 show that the contact 82 may be similar to the contacts 12, 42 described above in that each contact 82 may include a flat section 93 and a pair of arms 94 that extend from the flat section 93. The flat section 93 of each contact 82 may include the projections 91 that extend into the indentations 90 in the interior walls 84 of base 81. The size and shape of the flat section 93 and the arms 94 will depend in part on the size of the openings 87 in the base 81 and other design considerations that are associated with the electronic system 70.

As shown in FIGS. 13 and 14, each contact 82 may be positioned within an opening 87 such that the flat section 93 of each contact 82 is positioned against one of the interior walls 84 in the second group 86 of interior walls 84. In addition, the flat section 93 of each contact 82 may extend above the second group 86 of interior walls 84 such that the flat section 93 acts as a stop to prevent a pin 77 in the pin grid array from passing over the one of the interior walls 84 in the second group 86 of interior walls 84 (see, e.g., pin 77 movement illustrated in FIG. 14).

Figure 15:
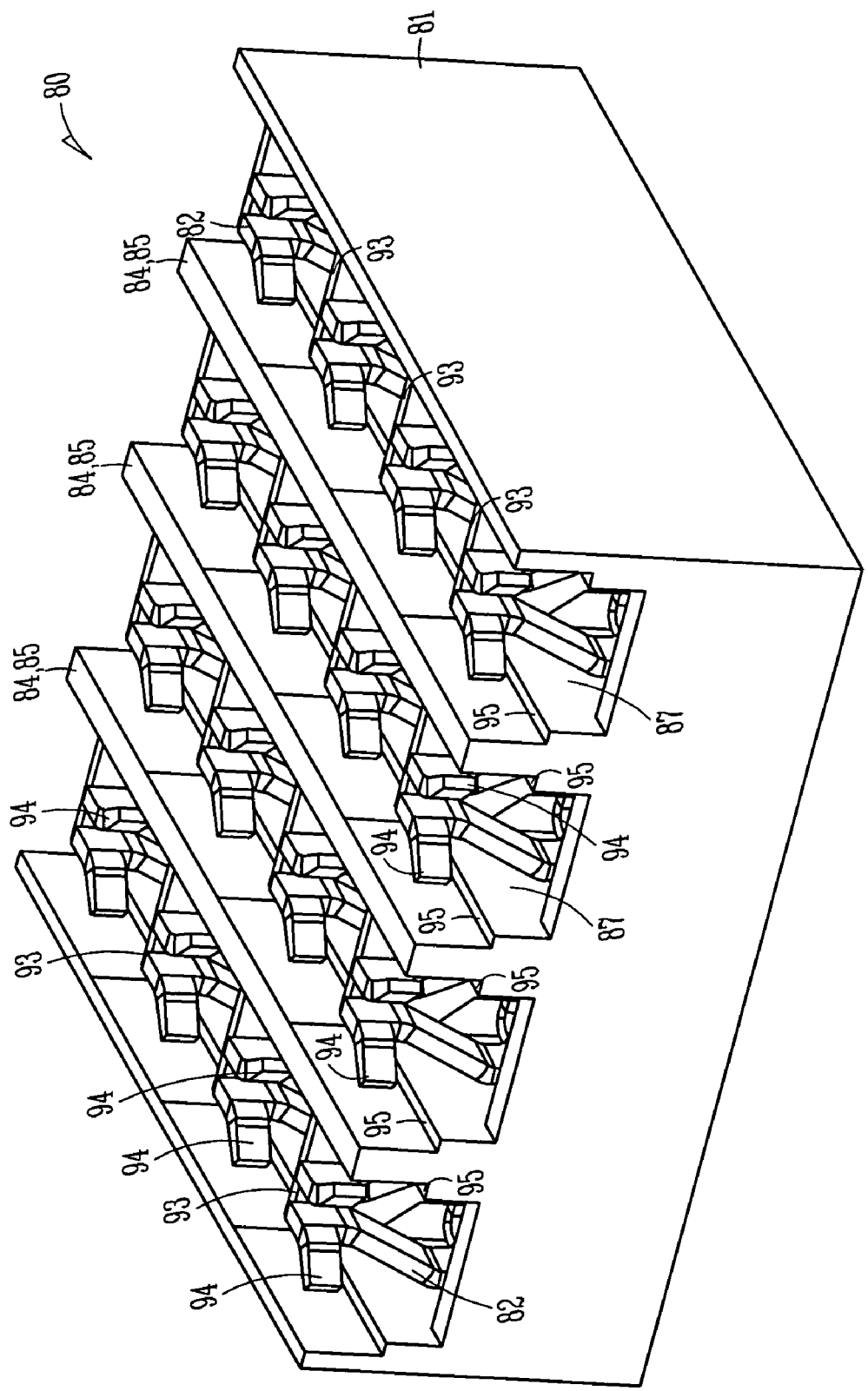
FIG. 15 is a perspective view illustrating a portion of another form of the example socket shown in FIG. 11.
Figure 16:
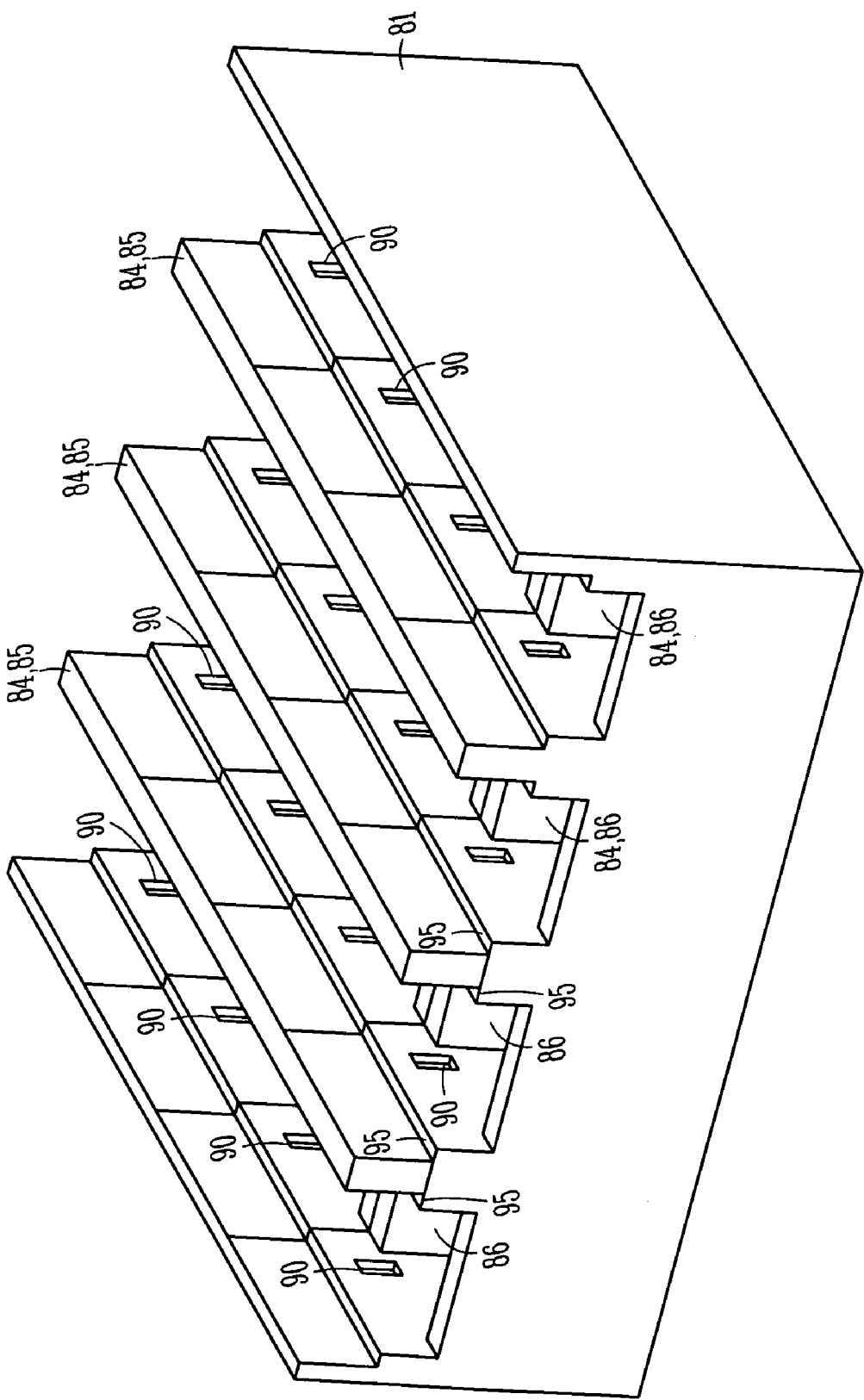
FIG. 16 is a perspective view of the example socket shown in FIG. 15 with the contacts removed from the socket.
Figure 17:
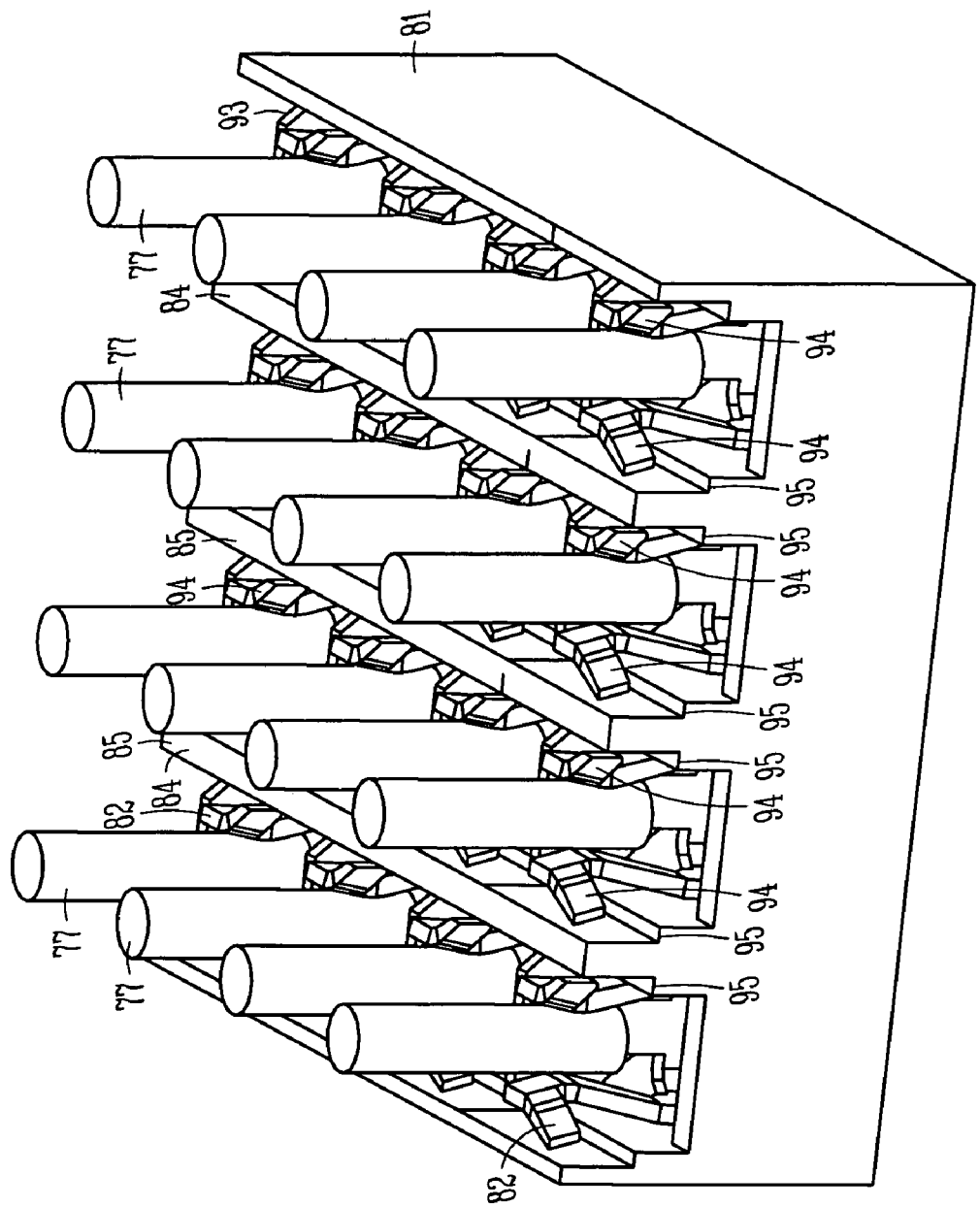
FIG. 17 is a perspective view of the example socket shown in FIG. 15 with pins engaging the contacts in the socket.

FIGS. 15 and 17 show that each of the interior walls 84 in the first group 85 of interior walls 84 may include a stepped section 95 on each side of the interior walls 84 in the first group 85 of interior walls 84. The stepped sections 95 may be located on the first group 85 of interior walls 84 such that the stepped sections 95 are higher than the second group 86 of interior walls 84 (see FIG. 16).

It should be noted that each arm 94 in the pair of arms on each contact 82 may extend toward a stepped section 95 on the interior walls 84 of the base 81 when a pin 77 in the pin grid array is inserted between the arms 94 on each contact 82 (see FIG. 17). The stepped sections 95 may permit the overall pitch of the socket 80 to be reduced because the stepped sections 95 allow more relative movement of the arms 94 on the contacts 82 when the pins 77 in the pin grid array are mated with the contacts 82.

Figure 18:
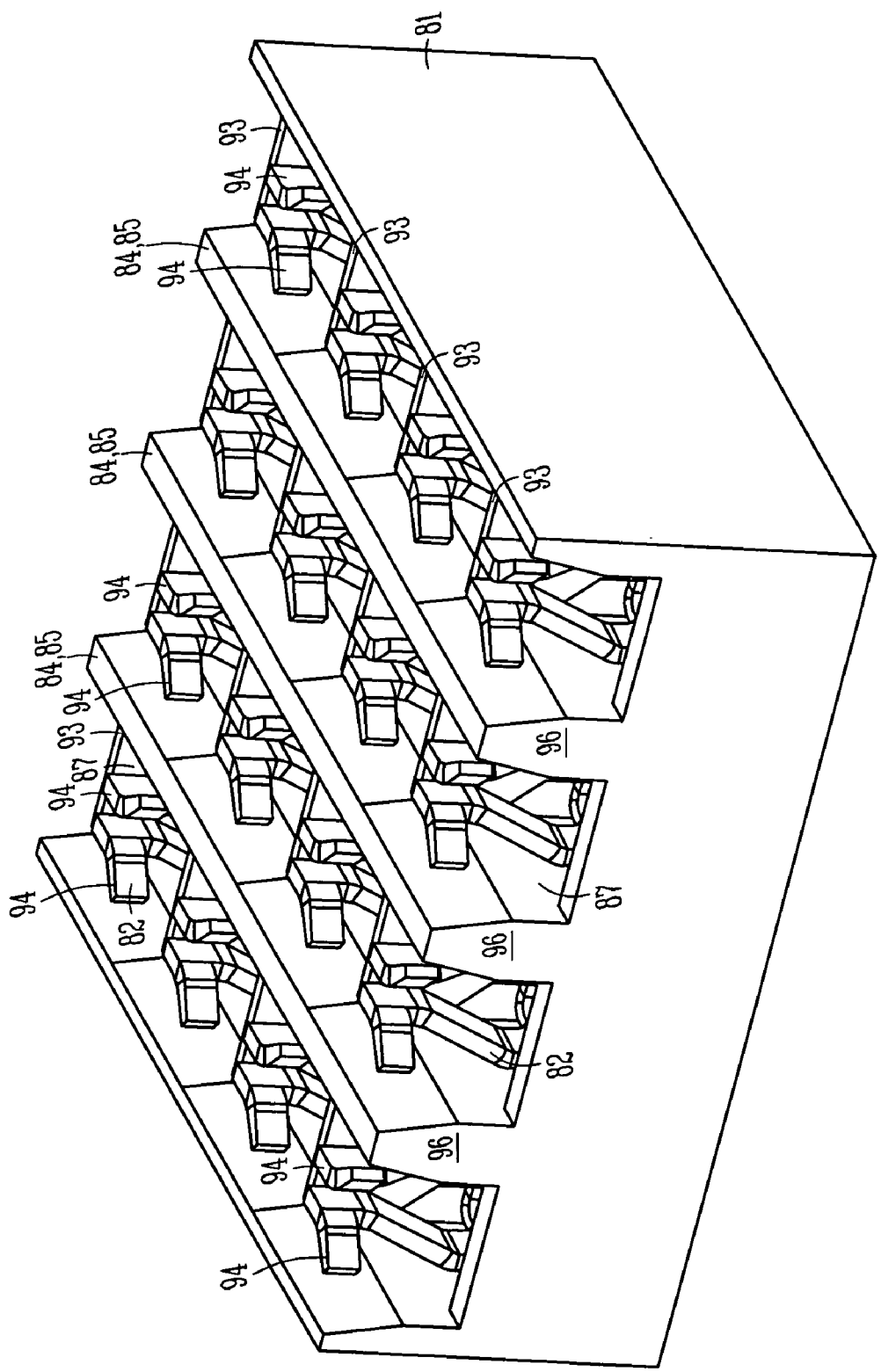
FIG. 18 is a perspective view illustrating a portion of another form of the example socket shown in FIG. 11.
Figure 19:
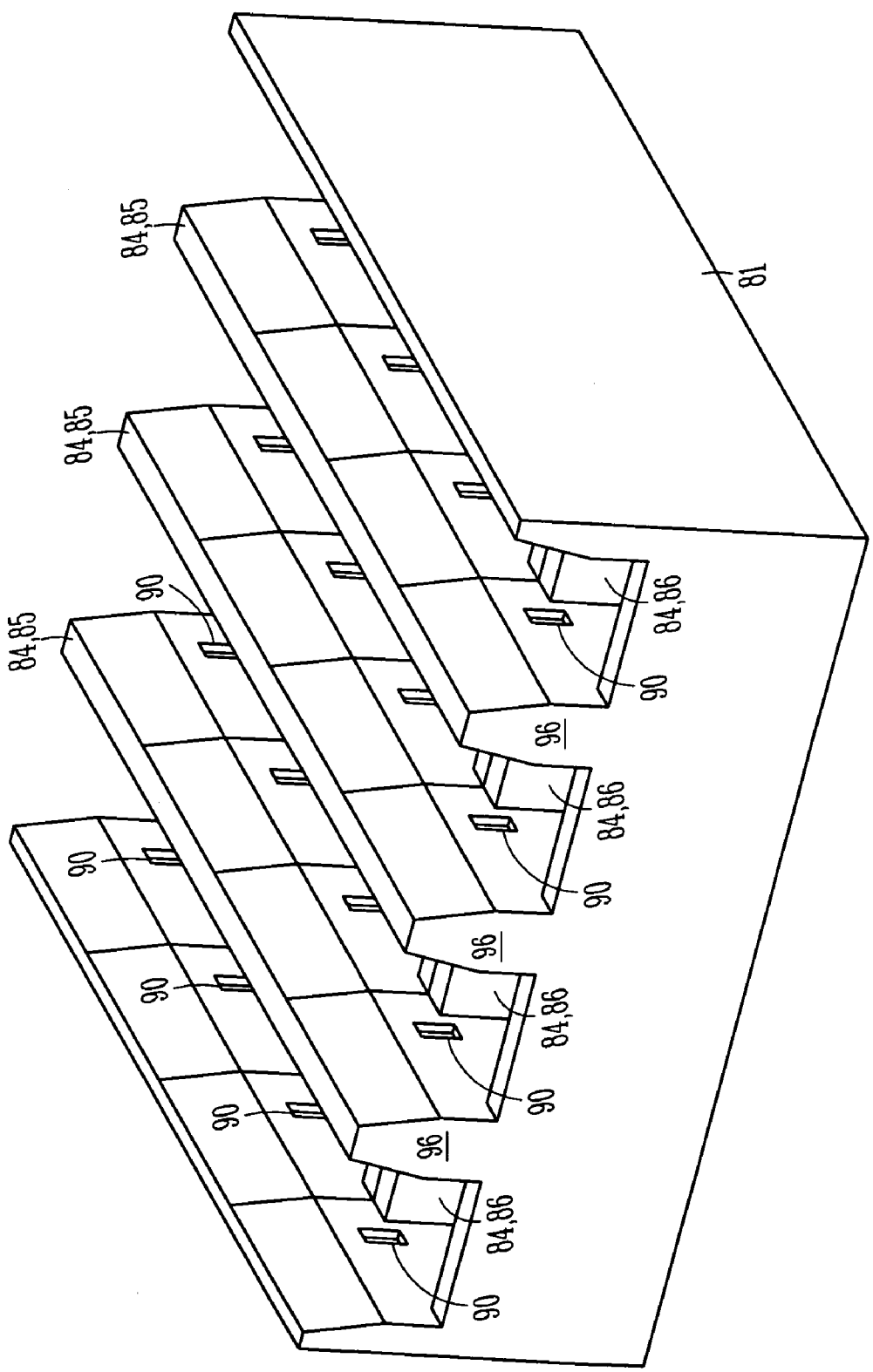
FIG. 19 is a perspective view of the example socket shown in FIG. 18 with the contacts removed from the socket.
Figure 20:
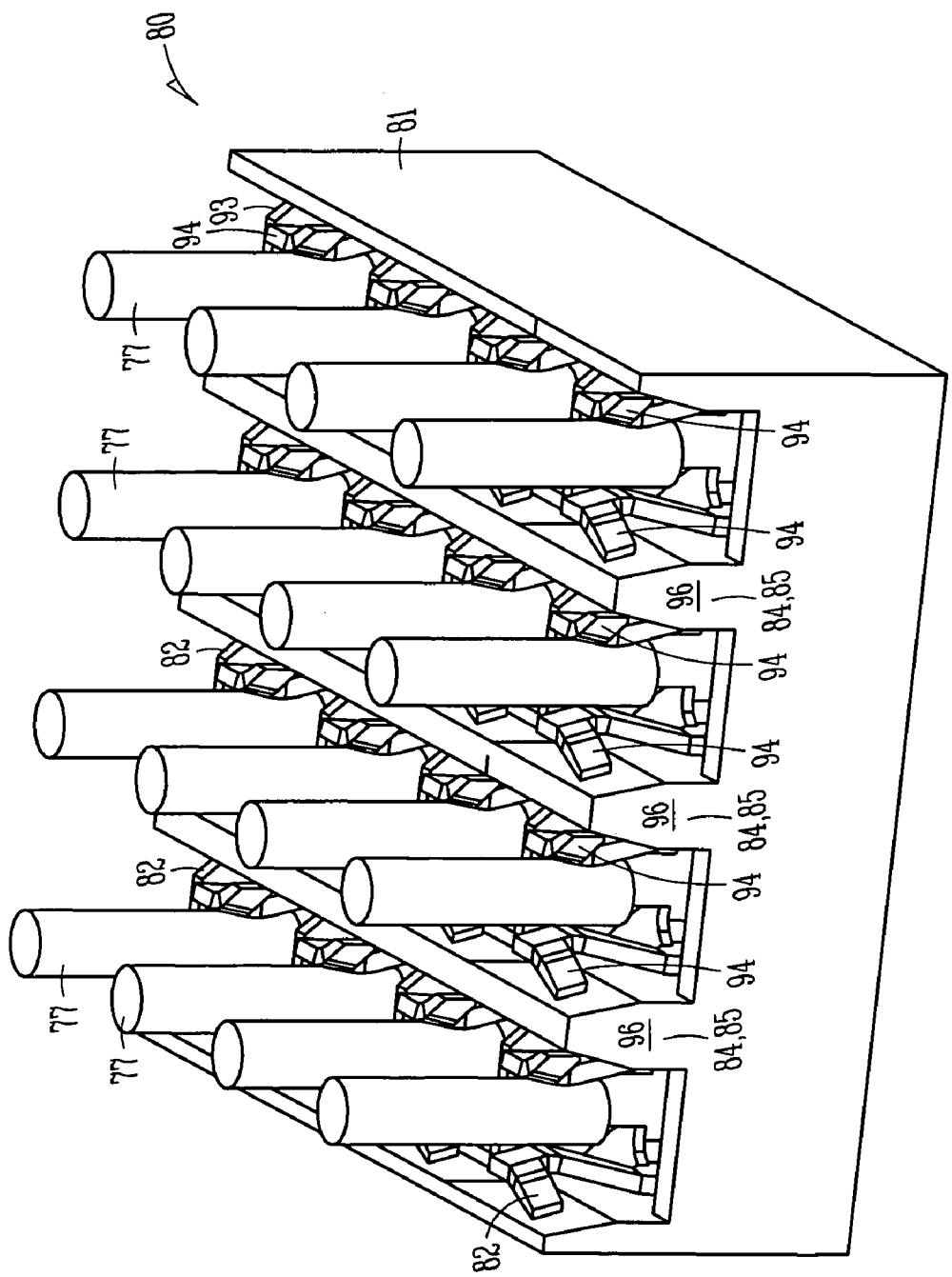
FIG. 20 is a perspective view of the example socket shown in FIG. 18 with pins engaging the contacts in the socket.

FIGS. 18 and 20 show that each of the interior walls 84 in the first group 85 of interior walls 84 may include a tapered section 96 on the interior walls 84 in the first group 85 of interior walls 84. The tapered sections 96 may be located on the first group 85 of interior walls 84 such that the tapered sections 96 are higher than the second group 86 of interior walls 84 (see FIG. 19).

It should be noted that each arm 94 in the pair of arms on each contact 82 may extend toward a tapered section 96 on the interior walls 84 of the base 81 when a pin 77 in the pin grid array is inserted between the arms 94 on each contact 82 (se FIG. 20). The tapered sections 96 may permit the overall pitch of the socket 80 to be reduced because the tapered sections 96 allow more relative movement of the arms 94 on the contacts 82 when the pins 77 in the pin grid array are mated with the contacts 82.

Electronic system 70 may be a computer system that includes a system bus which electrically couples the various components of electronic system 70 together. The components in the electronic system 70 will be determined based on the space available and the application where the electronic system 70 is to be used (among other factors). In some embodiments, the electronic system 70 may further include a voltage source 79 that is electrically coupled to the printed circuit board 78.

In one embodiment, die 74 is a processor which can be of any type. As used herein, processor means any type of circuit such as, but not limited to, a microprocessor, a microcontroller, a graphics processor or a digital signal processor.

It should be noted that many types of circuits may form part of die 74. Some example circuits include a custom circuit or an application-specific integrated circuit, such as a communications circuit for use in wireless devices (e.g., cellular telephones, pagers, portable computers, two-way radios, and similar electronic systems).

Electronic system 70 may also include an external memory that in turn may include one or more memory elements suitable to a particular application, such as a main memory in the form of random access memory (RAM) (see. e.g., RAM 99 in FIG. 10), one or more hard drives, and/or one or more drives that handle removable media, such as diskettes, compact disks (CDs) and digital video disks (DVDs).

The sockets and electronic systems described herein may be implemented in a number of different embodiments. The elements, materials, geometries, and dimensions can all be varied to suit particular packaging requirements.

FIGS. 1-20 are merely representational and are not drawn to scale. Certain proportions thereof may be exaggerated while others may be minimized.

The sockets and electronic systems described above may provide a solution for supplying additional signals to processors. The design of the socket may increase the overall contact density of the sockets that are used in the electronic systems which include processors. Many other embodiments will be apparent to those of skill in the art from the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed:

1. A socket that engages a pin grid array, the socket comprising:
   a plurality of contacts; and
   a base that includes exterior walls and a plurality of interior walls which extend between the exterior walls to form a plurality of openings within the base such that each opening in the base includes one of the plurality of contacts, at least some of the interior walls including indentations that receive projections on the contacts such that when the projections on the contacts are positioned within the indentations in the interior walls the contacts are secured to the base, wherein each of the indentations in the interior walls includes a base wall and four sidewalls, wherein each contact includes four projections that extend into four indentations in the interior walls of the base.

2. The socket of claim 1, wherein two of the four projections on each contact extend into indentations in an interior wall on one side of an opening and the other two projections on each contact extend into indentations in an interior wall on an opposing side of the opening.

3. A socket that engages a pin grid array, the socket comprising:
   a plurality of contacts; and
   a base that includes exterior walls and a plurality of interior walls which extend between the exterior walls to form a plurality of openings within the base such that each opening in the base includes one of the plurality of contacts, at least some of the interior walls including indentations that receive projections on the contacts such that when the projections on the contacts are positioned within the indentations in the interior walls the contacts are secured to the base, wherein each of the indentations in the interior walls includes a base wall and four sidewalls, wherein each contact includes a flat section and a pair of arms that extend from the flat section, the flat section of each contact including the projections that extend into the indentations in the interior walls of the base.

4. The socket of claim 3, wherein each contact is positioned within an opening such that the flat section of each contact is positioned against one of the interior walls that form the opening.

5. The socket of claim 3, wherein each of the openings is the same size.

6. The socket of claim 3, wherein each of the projections on each contact has a rectangular shape.

7. The socket of claim 6, wherein each of the indentations has a rectangular shape.

8. The socket of claim 3, wherein each of the contacts is the same size and shape.

* * * * *